United States Patent
Zhang et al.

(10) Patent No.: US 10,889,504 B2
(45) Date of Patent: Jan. 12, 2021

(54) OXIDE SEMICONDUCTOR COMPOSITION, MANUFACTURING METHOD THEREOF, THIN FILM TRANSISTOR AND DISPLAY APPARATUS

(71) Applicant: BOE TECHNOLOGY GROUP CO., LTD., Beijing (CN)

(72) Inventors: Wenlin Zhang, Beijing (CN); Ce Ning, Beijing (CN); Hehe Hu, Beijing (CN); Zhengliang Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/344,000

(22) PCT Filed: Sep. 17, 2018

(86) PCT No.: PCT/CN2018/105967
§ 371 (c)(1),
(2) Date: Apr. 22, 2019

(87) PCT Pub. No.: WO2019/134394
PCT Pub. Date: Jul. 11, 2019

(65) Prior Publication Data
US 2019/0233299 A1    Aug. 1, 2019

(51) Int. Cl.
*C01G 15/00* (2006.01)
*H01L 29/786* (2006.01)

(52) U.S. Cl.
CPC ........ *C01G 15/006* (2013.01); *H01L 29/7869* (2013.01); *C01P 2002/72* (2013.01); *C01P 2004/61* (2013.01)

(58) Field of Classification Search
CPC .................. C01G 15/006; H01L 29/7869
See application file for complete search history.

(56) References Cited

U.S. PATENT DOCUMENTS 7,892,457 B2    2/2011    Hosono et al.
8,791,457 B2    7/2014    Yano et al.
(Continued)

FOREIGN PATENT DOCUMENTS

CN    102832235 A    12/2012
EP    2006412 A1    12/2008

OTHER PUBLICATIONS

International Search Report and Written Opinion dated Dec. 19, 2018 in PCT/CN2018/105967.
1st Office Action dated Nov. 12, 2019 in CN201810004209.3.

*Primary Examiner* — Farun Lu
(74) *Attorney, Agent, or Firm* — Syncoda LLC; Feng Ma

(57) ABSTRACT

An oxide semiconductor composition for use in thin film transistors includes indium oxide, zinc oxide, and an oxide including a doping element of scandium, such as scandium oxide. A molar percentage of the indium oxide can be larger than approximately 50%. The oxide semiconductor composition can have a formula of $In_2Sc_2ZnO_7$. Manufacturing of the oxide semiconductor composition can include: mixing indium oxide powder, scandium oxide powder, and zinc oxide powder to thereby obtain an oxide shaped object; and sintering the oxide shaped object to form the oxide semiconductor composition. A thin-film transistor for use in a semiconductor device, such as a display apparatus, can include the oxide semiconductor composition, and can thereby have improved mobility of the oxide semiconductor due to the reduced oxygen vacancy therein.

17 Claims, 10 Drawing Sheets

(56) References Cited

U.S. PATENT DOCUMENTS

2013/0075720 A1 3/2013 Ahn et al.
2014/0102892 A1* 4/2014 Itose ................. H01L 29/78693
 204/298.13

* cited by examiner

OXIDE SEMICONDUCTOR COMPOSITION, MANUFACTURING METHOD THEREOF, THIN FILM TRANSISTOR AND DISPLAY APPARATUS

CROSS-REFERENCE TO RELATED APPLICATION

The present application claims priority to Chinese Patent Application No. 201810004209.3 filed on Jan. 3, 2018, the disclosure of which is hereby incorporated by reference in its entirety.

TECHNICAL FIELD

The present disclosure relates generally to the field of display technologies, and more specifically to an oxide semiconductor composition, its manufacturing method, a thin film transistor, and a display apparatus.

BACKGROUND

In existing display technologies, the active layer of oxide semiconductor thin film transistor (TFT) typically has a composition of indium gallium zinc oxide (IGZO). In an IGZO system, $In^{3+}$ has an electronic structure of $(4d)^{10}(5S)^0$, it is mainly responsible for the transmission of carriers, $Zn^{2+}$ is mainly responsible for stabilizing the crystal lattice of IGZO, $Ga^{3+}$ is mainly responsible for suppressing oxygen vacancy because of its stronger oxygen-binding capacity. As such, IGZO system is usually relatively stable.

In the IGZO system, on the other hand, $In_2O_3$ has a bixbyite structure, ZnO has a wurtzite structure, and indium and zinc has different oxygen coordination numbers. Therefore, under a low temperature, there is a serious lattice mismatch issue which can cause a lot of defects in the crystal lattice structure, in turn resulting in low mobility of the oxide semiconductor thin film transistor. Such a feature is disadvantageous for achieving high-definition display.

An oxide semiconductor thin film transistor (TFT) with a relatively high mobility rate can be used in low-temperature polycrystalline silicon (LTPS)-TFT display technologies to realize a higher-resolution and/or a rim-free display panel, or can be used in driving circuits in an OLED display panel, resulting in an improved driving performance and realizing a better complementation to the threshold voltage (i.e. Vth) of the driving transistor.

SUMMARY

In a first aspect, the present disclosure provides an oxide semiconductor composition.

The oxide semiconductor composition comprises indium oxide, zinc oxide, and an oxide comprising a doping element of scandium.

Herein the oxide comprising a doping element of scandium can be scandium oxide. Yet according to some other embodiments, the oxide comprising a doping element of scandium can optionally be an oxide that comprises other elements in addition to the doping element of scandium.

In the embodiments of the oxide semiconductor composition where the oxide comprising a doping element of scandium is scandium oxide, a molar ratio of the scandium oxide to the zinc oxide can be approximately 1:1.

According to some embodiments of the oxide semiconductor composition, a molar percentage of the indium oxide is larger than approximately 50%.

The oxide semiconductor composition according to certain preferred embodiments can have a formula of $In_2Sc_2ZnO_7$, and furthermore, the oxide semiconductor composition can have a density of approximately 7.03 $g/cm^3$.

In the oxide semiconductor composition, an average diameter of scandium zinc oxide can be smaller than 8 μm.

In oxide semiconductor composition can comprise impurity of lower than 8 ppm.

Optionally, the oxide semiconductor composition can have a surface roughness of smaller than 1.8 μm.

Further optionally, the oxide semiconductor composition can have an average flexural strength is larger than 60 megapascal.

In a second aspect, the present disclosure further provides a method of manufacturing an oxide semiconductor composition according to any one of the embodiments as described above.

Specifically, the oxide semiconductor composition can comprise indium oxide, zinc oxide, and an oxide comprising a doping element of scandium. Herein the oxide comprising a doping element of scandium can be scandium oxide, and a molar ratio of the scandium oxide to the zinc oxide can optionally be approximately 1:1. A molar percentage of the indium oxide can be larger than approximately 50%, and the oxide semiconductor composition can preferably have a formula of $In_2Sc_2ZnO_7$.

The manufacturing method can comprise the following two steps:

preparing an oxide shaped object; and sintering the oxide shaped object to form the oxide semiconductor composition.

According to some embodiments of the method, the step of preparing an oxide shaped object comprises the following sub-steps:

providing indium oxide powder, scandium oxide powder, and zinc oxide powder; and mixing the indium oxide powder, the scandium oxide powder, and the zinc oxide powder to thereby obtain the oxide shaped object.

Herein, the indium oxide powder can optionally have a specific surface area of about 8-10 $m^2/g$; the scandium oxide powder can optionally have a specific surface area of about 5-8 $m^2/g$; and the zinc oxide powder can optionally have a specific surface area of about 3-5 $m^2/g$.

Furthermore, the oxide shaped object can optionally have a specific surface area of about 6-7 $m^2/g$.

Further optionally, a median diameter of each of the indium oxide powder, the scandium oxide powder, and the zinc oxide powder can be smaller than about 1.8 μm.

According to some embodiments of the method, the step of sintering the oxide shaped object to form the oxide semiconductor composition comprises:

pressing and sintering the oxide shaped object under a temperature of 1200° C.-1500° C. and in presence of oxygen to thereby obtain the oxide semiconductor composition.

In a third aspect, the present disclosure further provides a thin film transistor.

The thin film transistor comprises an active layer having an oxide semiconductor composition according to any one of the embodiments as described above.

In a third aspect, a display apparatus is further disclosed.

The display apparatus comprises a thin film transistor according to any one of the embodiments as described above.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

Figure 1A:
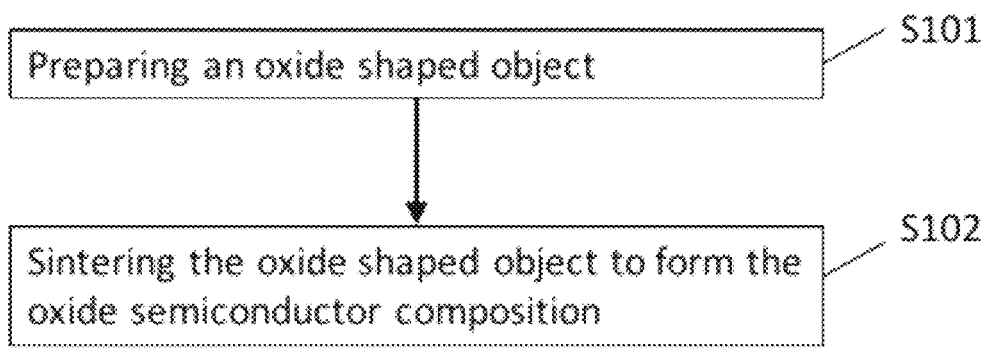
FIG. 1A is a flow chart of the method for manufacturing an oxide semiconductor composition according to some embodiments of the present disclosure.

In the following, with reference to the drawings of various embodiments disclosed herein, the technical details of the embodiments of the disclosure are to be described in a clear and understandable way.

It is obvious that the described embodiments are merely a portion but not all of the embodiments of the disclosure. Based on the described embodiments of the disclosure, those of ordinarily skills in the art can obtain other embodiment(s), which come(s) within the scope sought for protection by the disclosure.

The present disclosure provides an oxide semiconductor composition, a manufacturing method thereof, a thin film transistor and a display apparatus, which can be employed to reduce oxygen vacancy in the oxide semiconductor and therefore improve the mobility of the oxide semiconductor.

In a first aspect, an oxide semiconductor composition is disclosed.

According to some embodiments of the disclosure, the oxide semiconductor composition comprises the following elements: oxygen (O), indium (In), zinc (Zn) and scandium (Sc). According to some specific embodiments, the oxide semiconductor composition can have a composition of indium scandium zinc oxide ($In_2Sc_2ZnO_7$).

Table 1 illustrates ionic radiuses of the positive metal ions of indium and scandium and their capacities to bind oxygen. As shown in Table 1, $Sc^{3+}$ and $In^{3+}$ have similar ionic radiuses. Because of the relatively high dissociation energy of the Sc—O bond, $Sc_2O_3$ has a relatively wide band gap. In addition, $Sc^{3+}$ has a relatively low electronegativity, and $Sc^{3+}$ and $O^{2-}$ have similar binding coordinates.

Thus compared with a conventional semiconductor composition in existing display technologies, these above embodiments of the oxide semiconductor composition (i.e. the indium scandium zinc oxide) has reduced oxygen vacancy in the metal oxide, as well as reduced defects in the crystal lattice structure, resulting in an improved mobility of the oxide semiconductor composition. In turn, the mobility of the oxide semiconductor can ultimately be improved.

TABLE 1

| Ions | Ionic radius (Å) | Dissociation Energy of M—O Bond (KJ · mol$^{-1}$) |
| --- | --- | --- |
| $In^{3+}$ | 0.79 | 346 |
| $Sc^{3+}$ | 0.75 | 680 |
| $Zr^{4+}$ | 0.72 | 766.1 ± 10.6 |

In some embodiments of the oxide semiconductor composition, the molar percentage of indium content relative to indium, scandium and zinc is larger than 50%. $In^{3+}$ is mainly responsible for the transmission of carriers, and $In_2O_3$ usually has relatively high mobility. Because the content of indium is relatively high, the number of electron transmission orbits of the oxide semiconductor composition can be ensured, therefore, higher mobility of the oxide semiconductor composition can be ensured.

In some embodiments of the oxide semiconductor composition where the molar percentage of indium content in the oxide semiconductor composition is more than approximately 50%, the molar ratio of scandium and zinc in the oxide semiconductor composition is approximately 1:1. As such, the molar ratio of indium, scandium and zinc may be 70:15:15, 60:20:20, or 80:10:10, and so on.

In some embodiments of the oxide semiconductor composition, the density of the oxide semiconductor composition is approximately 7.03 g/cm$^3$.

In some embodiments of the oxide semiconductor composition, the average diameter of scandium zinc oxide in the oxide semiconductor composition is smaller than approximately 8 μm.

In some embodiments of the oxide semiconductor composition, the total weight of the oxygen, indium, scandium, and zinc in the oxide semiconductor composition is larger than 99.9992%. As a result, the purity of $In_2Sc_2ZnO_7$ in the oxide semiconductor composition can be ensured, therefore, the mobility of the thin film transistor made of the oxide semiconductor composition according to some embodiments of the present disclosure can be ensured.

In an oxide semiconductor thin film made of the oxide semiconductor composition according to some embodiments of the present disclosure, the film quality of the oxide semiconductor film may be influenced by the surface roughness and the average flexural strength of the target. As such, in some embodiments, the surface roughness of the oxide semiconductor composition is smaller than about 1.8 µm; and the average flexural strength of the oxide semiconductor composition is larger than about 60 megapascal (MPa). As a result, the film quality of the semiconductor layer made of the oxide semiconductor composition according to some embodiments of the present disclosure can be ensured.

It is noted that in addition to the above embodiments of the oxide semiconductor composition comprising oxygen (O), indium (In), zinc (Zn) and scandium (Sc), other embodiments of the oxide semiconductor composition are also possible.

According to some other embodiments of the disclosure, the oxide semiconductor composition can be an indium zirconium zinc oxide comprising elements of oxygen (O), indium (In), zinc (Zn) and zirconium (Zr), and can specifically have a composition of $In_2ZrZnO_6$. Further as shown in Table 1, $Zr^{4+}$ and $In^{3+}$ have similar ionic radiuses. Because of the relatively high dissociation energy of the Zr—O bond, $ZrO_2$ also has a relatively wide band gap. In addition, $Zr^{4+}$ has a relatively low electronegativity, and $Zr^{4+}$ and $O^{2-}$ have similar binding coordinates.

Thus compared with a conventional oxide semiconductor composition for fabricating the oxide semiconductor in existing display technologies, these above embodiments of the oxide semiconductor composition (i.e. the indium zirconium zinc oxide) has reduced oxygen vacancy in the metal oxide, as well as reduced defects in the crystal lattice structure, resulting in an improved mobility of the oxide semiconductor composition. In turn, the mobility of the oxide semiconductor can ultimately be improved.

In a second aspect, in correspondence to the oxide semiconductor composition described above, the present disclosure further provides a manufacturing method of the oxide semiconductor composition.

FIG. 1A illustrates a manufacturing method according to some embodiments of the disclosure. As shown in FIG. 1A, the method comprises the following steps:

S101: preparing an oxide shaped object; and
S102: sintering the oxide shaped object to form the oxide semiconductor composition.

Figure 1B:
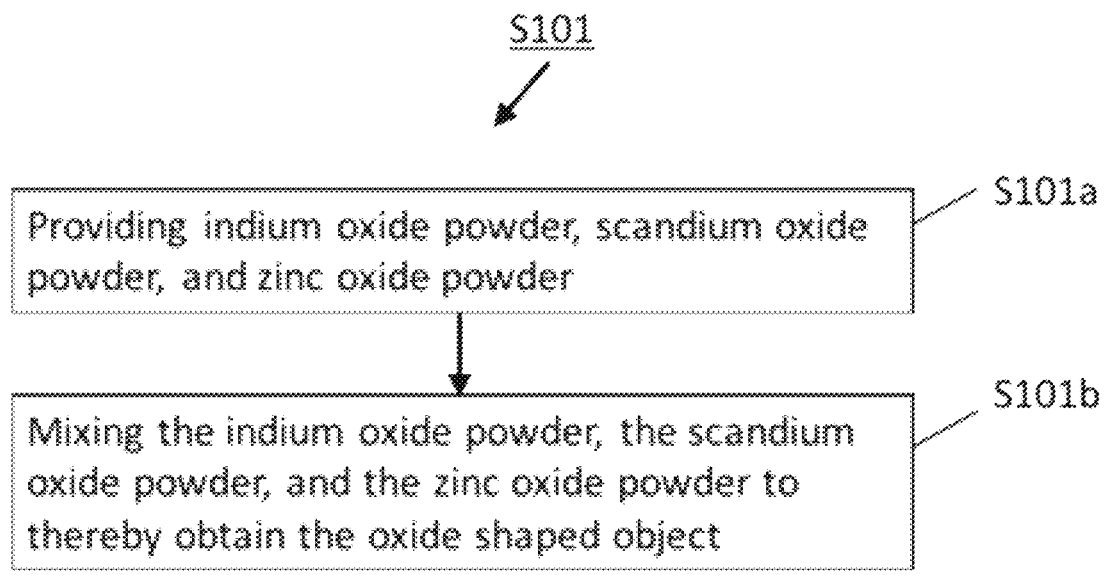
FIG. 1B and FIG. 1C are respectively a flow chart of the step S101 in the method for manufacturing an oxide semiconductor composition according to two different embodiments of the present disclosure.

Specifically, in some embodiments of the method where the oxide semiconductor composition is an indium scandium zinc oxide, the step of preparing an oxide shaped object (i.e. S101) specifically comprises the sub-steps S101a and S101b, as shown in FIG. 1B.

S101a: providing indium oxide powder, scandium oxide powder, and zinc oxide powder; and
S101b: mixing the indium oxide powder, the scandium oxide powder, and the zinc oxide powder to thereby obtain the oxide shaped object.

Figure 1C:
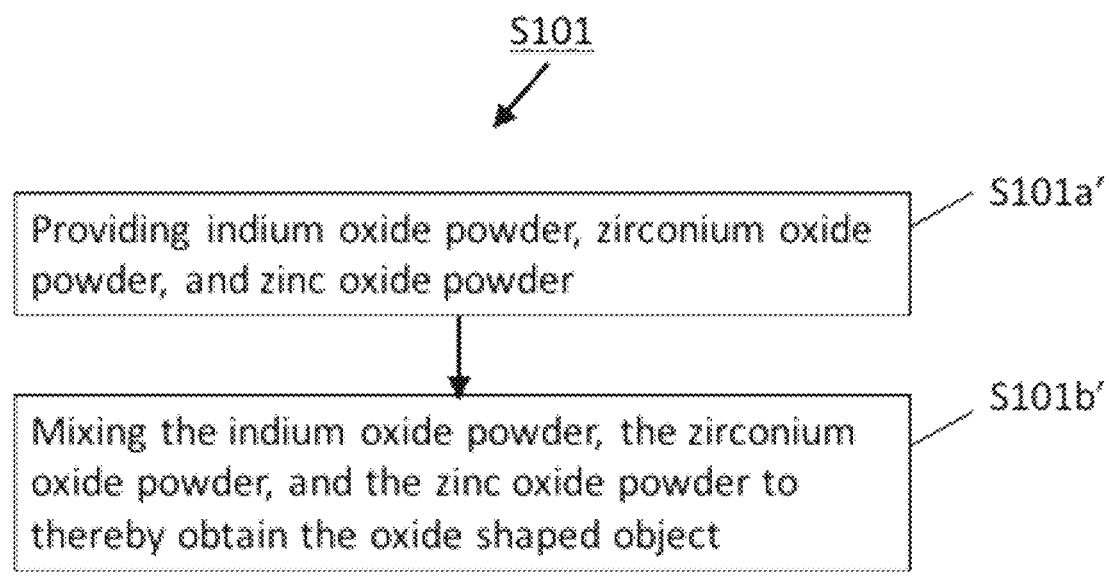

In some other embodiments of the method where the oxide semiconductor composition is an indium zirconium zinc oxide, the step of preparing an oxide shaped object (i.e. S101) specifically comprises the sub-steps S101a' and S101b', as shown in FIG. 1C.

S101a': providing indium oxide powder, zirconium oxide powder, and zinc oxide powder; and
S101b': mixing the indium oxide powder, the zirconium oxide powder, and the zinc oxide powder to thereby obtain the oxide shaped object.

In some embodiments of the method where the oxide semiconductor composition is an indium scandium zinc oxide ($In_2Sc_2ZnO_7$), the step of sintering the oxide shaped object to form the oxide semiconductor composition (i.e. S102) specifically comprises:

S102a: pressing and sintering the oxide shaped object under a temperature of 1200° C.-1500° C. and in an environment containing oxygen to obtain the oxide semiconductor composition.

In some embodiments of the method, the range of the specific surface areas of the indium oxide powder, the scandium oxide powder, and the zinc oxide powder are respectively 8-10 $m^2/g$, 5-8 $m^2/g$, and 3-5 $m^2/g$. The median diameter of the indium oxide powder, the scandium oxide powder, and the zinc oxide powder are smaller than about 1.8 µm; and the range of the specific surface areas of the oxide shaped object is about 6-7 $m^2/g$.

It should be noted that when manufacturing an $In_2Sc_2ZnO_7$ semiconductor composition through the method disclosed above, the material for manufacturing $In_2Sc_2ZnO_7$ usually contains impurity, such as iron (Fe), aluminum (Al), silicon (Si), titanium (Ti), molybdenum (Mo), and so on, the part per million (PPM) of the impurity in the $In_2Sc_2ZnO_7$ semiconductor composition should be controlled to be under about 8 PPM in order to ensure the purity of the $In_2Sc_2ZnO_7$ in the oxide semiconductor composition, and to further ensure the film quality of the oxide semiconductor.

FIGS. 2-9 provide information about the testing of the $In_2Sc_2ZnO_7$ semiconductor composition manufactured through some embodiments of the method.

Figure 2:
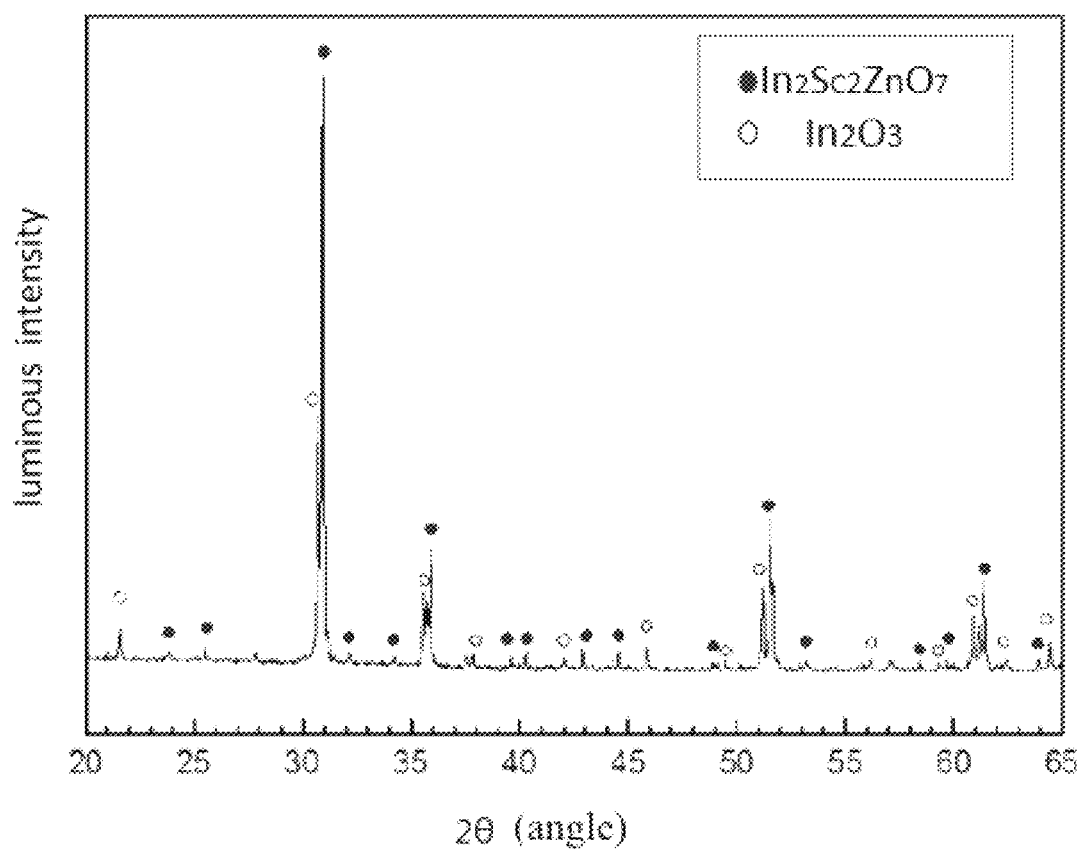
FIG. 2 is a XRD spectrum of the $In_2Sc_2ZnO_7$ semiconductor composition according to some embodiments of the present disclosure.

FIG. 2 shows an X-ray diffraction (XRD) spectrum of the $In_2Sc_2ZnO_7$ semiconductor composition, where the vertical ordinate and horizontal ordinate are respectively the angle and the luminous intensity.

Figure 3:
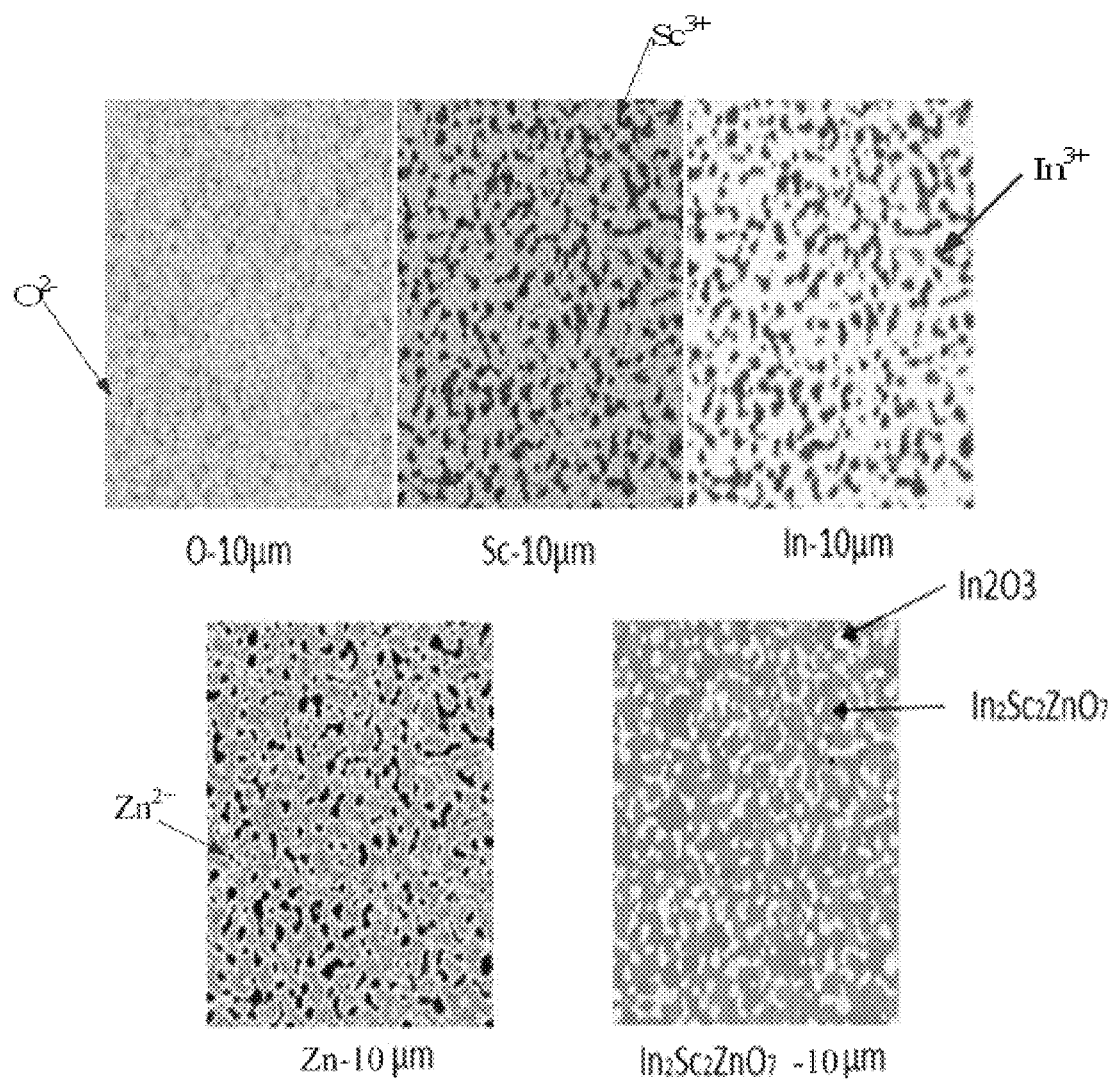
FIG. 3 is an electron probe microanalysis (EPMA) diagram of the $In_2Sc_2ZnO_7$ semiconductor composition according to some embodiments of the present disclosure.

FIG. 3 illustrates an electron probe microanalysis (EPMA) diagram of the $In_2Sc_2ZnO_7$ semiconductor composition, where the size of the testing microregion for applying electron probe testing to the semiconductor composition is about 10×10 µm. It can be seen from FIG. 3 that the content of indium is high, thus ensuring a number of electron transmission orbits of the semiconductor composition and ensuring a high mobility of the semiconductor composition.

Figure 4:
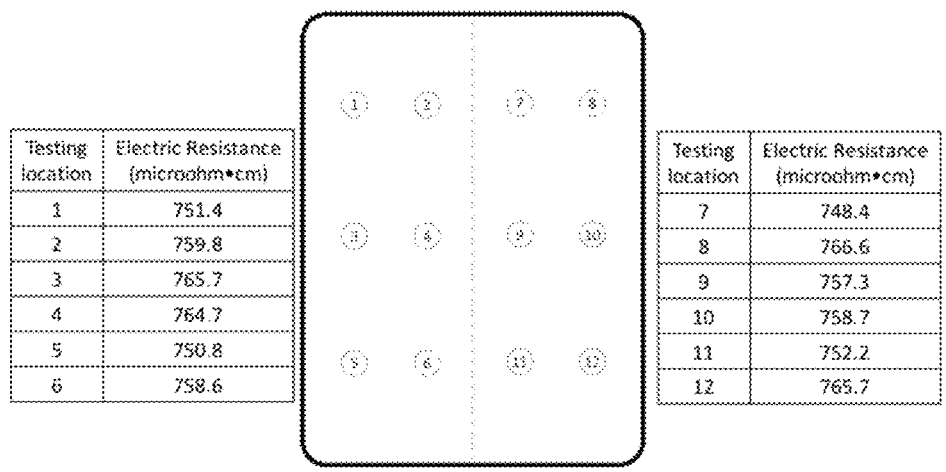
FIG. 4 is a schematic diagram of the result of electric resistance testing for the $In_2Sc_2ZnO_7$ semiconductor composition having a size of 550×690×6 mm according to some embodiments of the present disclosure.

FIG. 4 shows the resistance testing result of an $In_2Sc_2ZnO_7$ semiconductor composition with a size of about 550×690×6 mm and a density of 7.03 $m^2/g$, where the dimension error of the semiconductor composition is ±1 mm. Six points on the left half portion (locations 1-6) and six points on the right half portion (locations 7-12) of the semiconductor composition are respectively selected for the resistance test, and the specific testing locations and testing results are as shown in FIG. 4.

Figure 5:
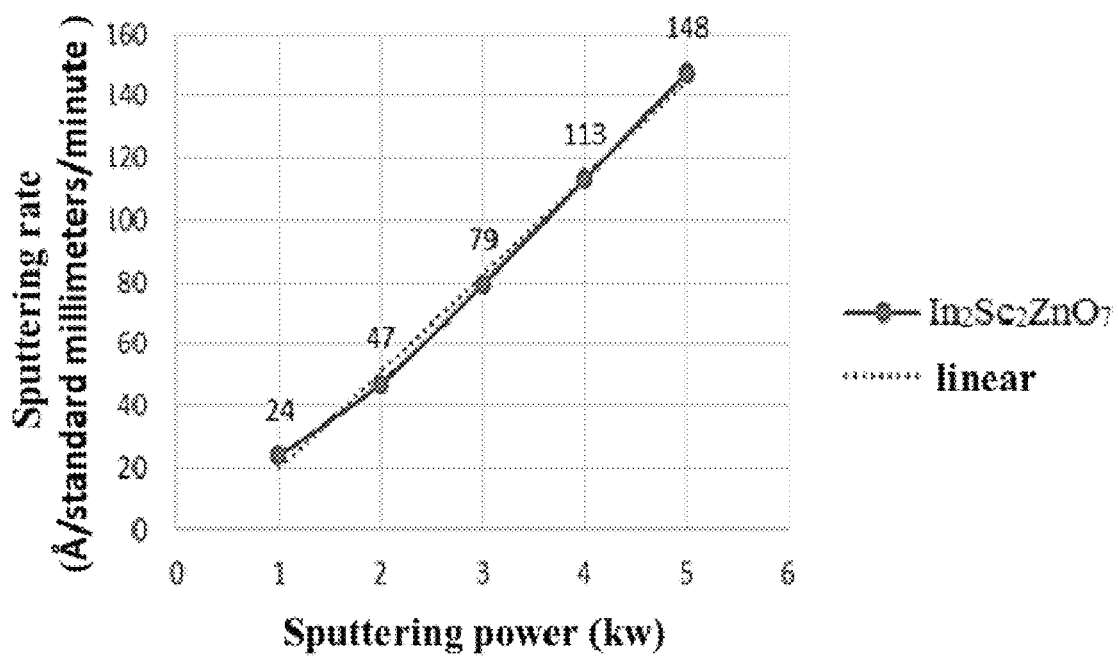
FIG. 5 is a schematic diagram of a sputtering rate curve of the $In_2Sc_2ZnO_7$ semiconductor composition according to some embodiments of the present disclosure.
Figure 6:
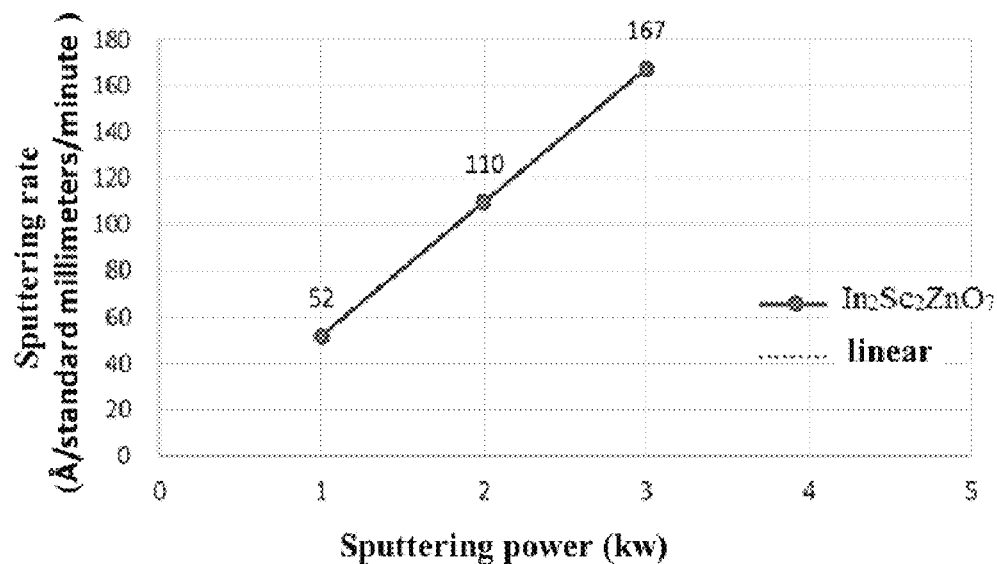
FIG. 6 is a schematic diagram of a sputtering rate curve of the $In_2Sc_2ZnO_7$ semiconductor composition according to some embodiments of the present disclosure.

FIG. 5 and FIG. 6 respectively show schematic diagrams of the sputtering rate curve for the $In_2Sc_2ZnO_7$ semiconductor composition where the total amount of chamber gas flow is about 50 standard cubic centimeters per minute (sccm, or standard millimeters per minute) and the content of oxygen is respectively about 30% and about 5%. In FIG. 5 and FIG. 6, the horizontal ordinate represents the sputtering power, and the vertical ordinate represents the sputtering rate.

Figure 7:
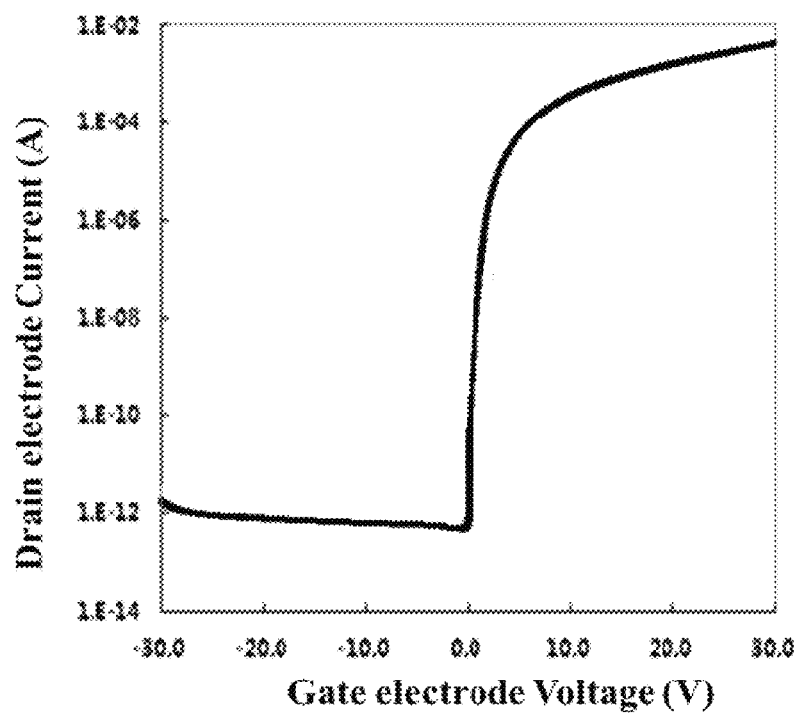
FIG. 7 is a schematic diagram of the I-V curve of the thin film transistor according to some embodiments of the present disclosure.
Figure 8:
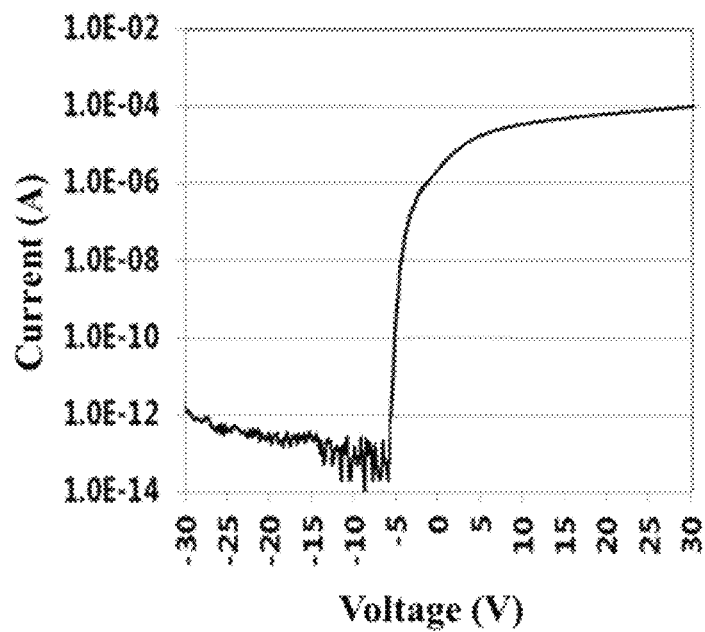
FIG. 8 is a schematic diagram of the NBTIS curve of the thin film transistor according to some embodiments of the present disclosure.
Figure 9:
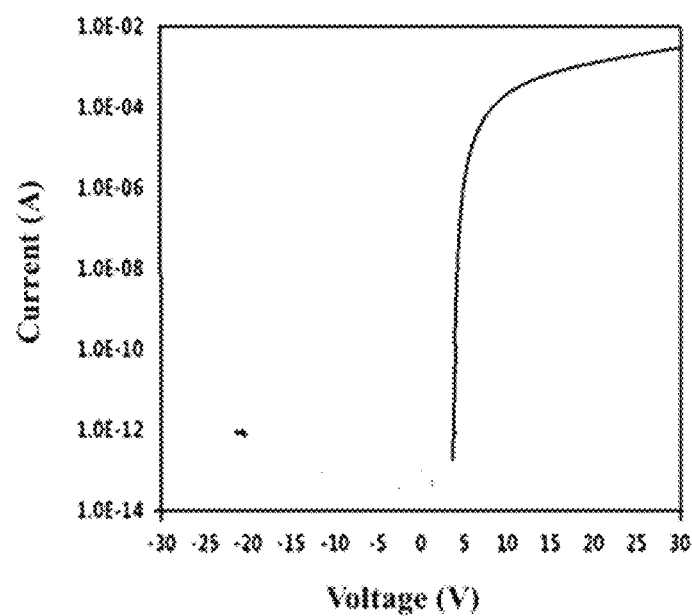
FIG. 9 is a schematic diagram of the PBTS curve of the thin film transistor according to some embodiments of the present disclosure.

FIG. 7-FIG. 9 illustrate testing results of the thin film transistor made of $In_2Sc_2ZnO_7$ semiconductor composition. FIG. 7 is the I-V curve of thin film transistor. FIG. 8 shows negative bias illumination stress (NBTIS) characteristic curve after 8 hours of applying voltages to the gate electrode of the thin film transistor. In FIG. 8, the horizontal ordinate represents voltages applied to the gate electrode, the vertical ordinate represents electric current.

FIG. 9 illustrates positive bias temperature stress (PBTS) testing curve after 1 hour of applying voltages to the gate electrode of the thin film transistor. In FIG. 9, the horizontal ordinate represents the voltages applied to the gate electrode, and vertical ordinate represents electric current.

Specifically, the following is the information of the $In_2Sc_2ZnO_7$ semiconductor composition manufactured through embodiments of the method as tested in FIGS. 2-9. The oxide shaped object is made through mixing indium oxide powder, scandium oxide powder, and zinc oxide powder, the range of the specific surface areas of the indium oxide powder, the scandium oxide powder, and the zinc oxide powder are respectively 8-10 $m^2/g$, 5-8 $m^2/g$ and 3-5 $m^2/g$; the median diameter of the indium oxide powder, the scandium oxide powder and the zinc oxide powder are smaller than 1.8 μm; the range of the specific surface areas of the oxide shaped object is 6-7 $m^2/g$.

The oxide sintered object is obtained by pressing and sintering the oxide shaped object under a temperature of 1200° C.-1500° C. and in an environment containing oxygen. The molar ratio of indium, scandium and zinc in the oxide sintered object is 70:15:15, the density of the oxide sintered object is 7.03 $m^2/g$, the average diameter of the scandium zinc oxide in the oxide sintered object is smaller than 8 μm, the surface roughness of the oxide sintered object is smaller than 1.8 μm; the average flexural strength of the oxide sintered target is larger than 60 megapascal, and the total weight of oxygen, indium, scandium and zinc in the oxide sintered object is no less than 99.9992%. In addition, the mobility of the thin film transistor made by the aforementioned $In_2Sc_2ZnO_7$ semiconductor composition according to some embodiments of the present disclosure is 31.4 $cm^2/(V.S)$.

In a third aspect, in correspondence to the oxide semiconductor composition described above, the present disclosure further provides a thin film transistor. The semiconductor layer of the thin film transistor can be made of the oxide semiconductor composition according to each aforementioned embodiment of the oxide semiconductor composition.

In the thin film transistor, because the semiconductor layer is made of the oxide semiconductor composition, there is relatively less oxygen vacancy in the semiconductor layer of the thin film transistor, and the semiconductor layer of the thin film transistor thus has a relatively higher mobility. When the thin film transistor disclosed herein is used in a display product (e.g. a display apparatus), the resolution of the display product can be improved, the driving capability of the display product can also be improved, realizing a better compensation to the threshold voltage ($V_{th}$) of the thin film transistor.

In a fourth aspect, a display apparatus is further disclosed. The display apparatus comprises the thin film transistor according to any one of the embodiments as described above.

Herein, the display apparatus may be a display panel, such as a liquid crystal display panel, or an organic light-emitting diode display panel. It may also be other types of a device comprising a display panel, for example, it may be mobile phones, computers, televisions and so on.

Figure 10:
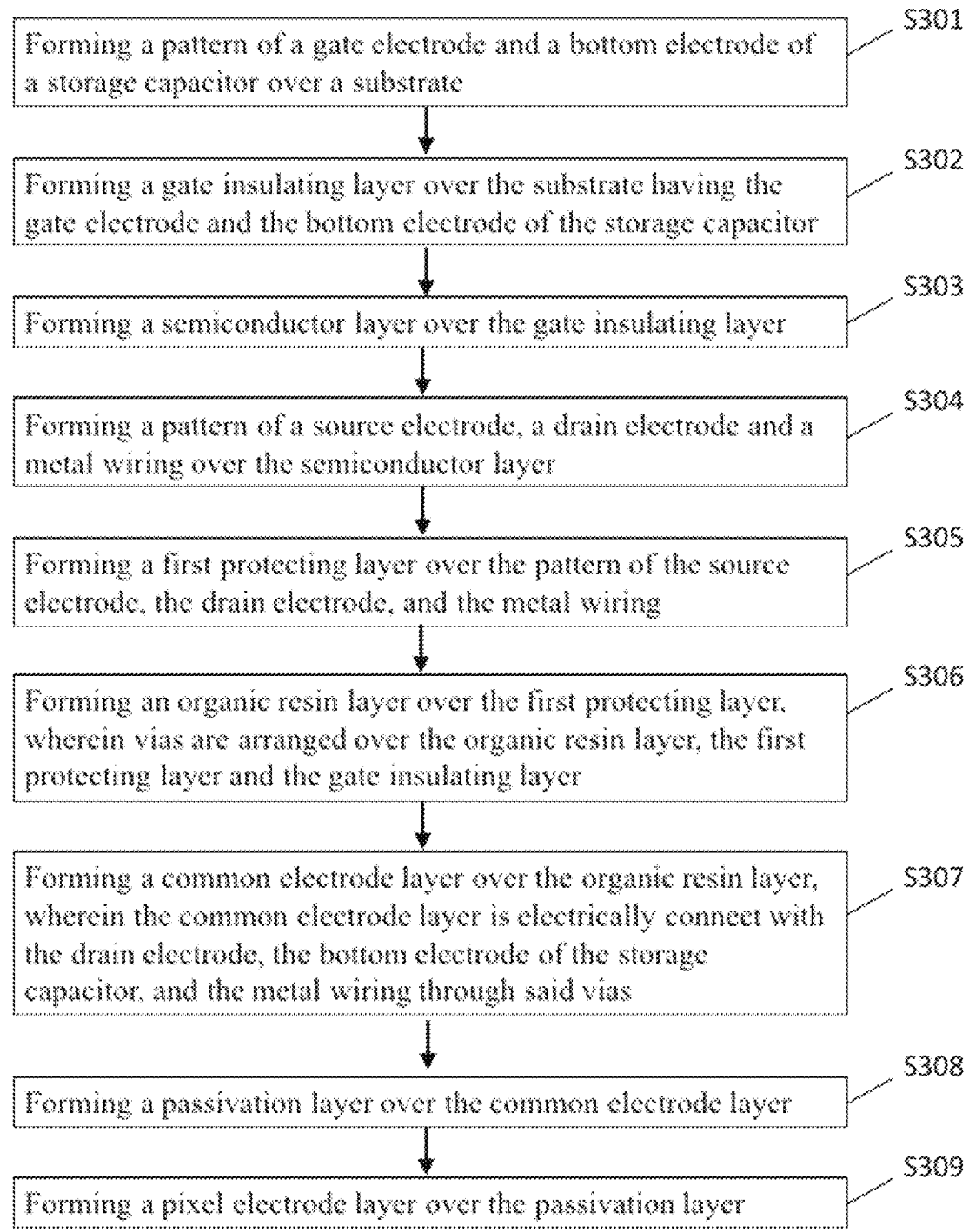
FIG. 10 illustrates a flow chart of the manufacturing process of the display panel according to some embodiments of the present disclosure
Figure 11A:
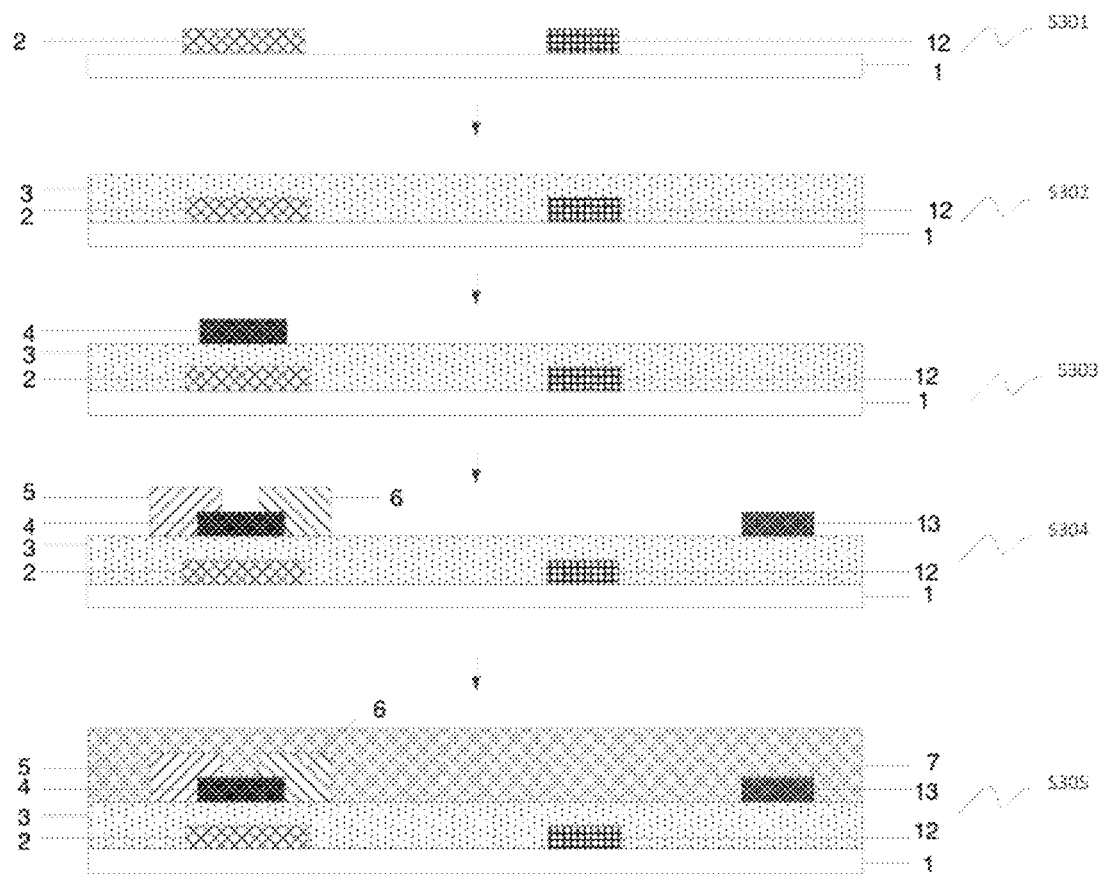
FIGS. 11A and 11B illustrate the intermediates of the display panel being manufactured through the manufacturing method as shown in FIG. 10.
Figure 11B:
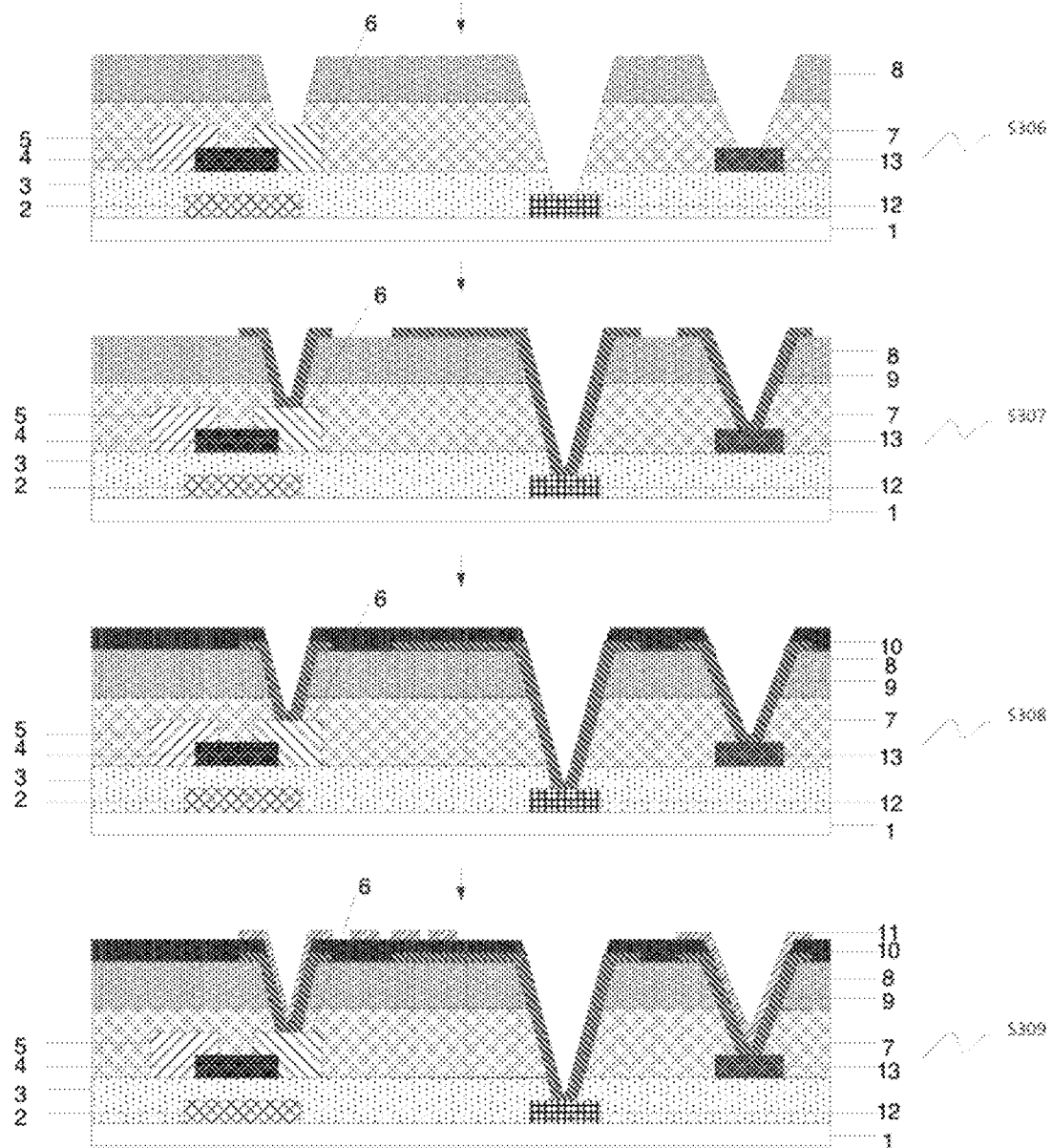

In the following, the manufacturing method of the display panel according to some embodiments of the present disclosure will be descried with the examples in which the material of the semiconductor layer of the thin film transistor is indium scandium zinc oxide. The manufacturing method specifically comprises the following steps S301-S309, as illustrated in FIG. 10, and the intermediates of the display panel being manufactured through the method are illustrated in FIGS. 11A and 11B.

S301: forming a pattern of a gate electrode 2 and a bottom electrode 12 of a storage capacitor over a substrate 1.

Specifically in step S301, a first metal layer can be first formed on the substrate 1 via a metal layer sputtering process using a Magnetron sputtering equipment. Then, a photo etching process can be conducted to the metal layer to thereby form a pattern of the gate electrode 2 and the bottom electrode 12 of the storage capacitor.

Herein, the material of the metal layer may comprise any one or any combination of the following: Al, Mo, Al—Nd alloy (AlNd), copper (Cu), or molybdenum niobium alloy (MoNb), and the thickness of the metal layer can be between 3000 Å and 4000 Å.

S302: forming a gate insulating layer 3 over the substrate 1 having the gate electrode 2 and the bottom electrode 12 of the storage capacitor.

Specifically in step S302, the gate insulating layer 3 can be formed via a deposition process using a plasma enhanced chemical vapor deposition (PECVD) equipment. Herein, the material of the gate insulating layer may comprise any one or any combination of the following: silicon nitride ($Si_3N_4$), silicon oxide (SiO), and the thickness of the gate insulating layer can be between 3000 Å and 5000 Å.

S303: forming a semiconductor layer 4 over the gate insulating layer 3.

Specifically in step S303, the semiconductor layer 4 can comprise $In_2Sc_2ZnO_7$, and the semiconductor layer 4 can be formed by means of a plasma enhanced chemical vapor deposition (PECVD) equipment, and the pattern of the semiconductor layer can be formed via a photo etching process, followed by an anneal process under a temperature of around 300° C. After this step, the thickness of the semiconductor layer 4 can be between 400 Å and 700 Å.

S304: forming a pattern of a source electrode 5, a drain electrode 6 and a metal wiring 13 over the semiconductor layer 4.

Specifically in step S304, a second metal layer can be first formed via a metal layer sputtering process using plasma enhanced chemical vapor deposition equipment. Then a photo etching process can be conducted over the metal layer to thereby form the patterns of the source electrode, the drain electrode, and the metal wiring.

Herein the material of the second metal layer may comprise the any one or any combination of the following: Al, Mo, AlNd, Cu, MoNb; and the thickness of the metal layer may be between 3000 Å-4000 Å.

S305: Forming a first protecting layer 7 over the pattern of the source electrode 5, the drain electrode 6, and the metal wiring 13.

Specifically in step S305, deposition of the first protecting layer (PVX) can be conducted via PECVD, the material of the first protecting layer may comprise any one or any combination of the following: $SiO_2$, silicon oxynitride ($SiO_xN_y$), $Si_3N_4$, and the thickness can be between 1500 Å and 3000 Å.

S306: Forming an organic resin layer 8 over the first protecting layer 7, wherein vias are arranged over the organic resin layer 8, the first protecting layer 7 and the gate insulating layer 3.

Specifically in step S306, the organic resin layer can be formed through a resin coating process, and the thickness of the organic resin layer shall be between 1.7 μm and 2.2 μm.

S307: forming a common electrode layer 9 over the organic resin layer 8, wherein the common electrode layer 9 is electrically connected with the drain electrode 6, the bottom electrode 12 of the storage capacitor, and the metal wiring 13 through said vias.

Specifically in step S307, the thickness of the common electrode layer 9 can be between 400 Å and 700 Å.

S308: forming a passivation layer 10 over the common electrode layer 9;

Specifically in step S308, the passivation layer may be conducted via a deposition process using PECVD equipment, the material of the passivation layer may comprise any one or any combination of the following: $SiO_2$, $SiO_xN_y$, $Si_3N_4$, and the thickness of the passivation layer may be between 1000 Å-3000 Å;

S309: forming a pixel electrode 11 layer over the passivation layer 10.

Specifically in step S309, the thickness of the pixel electrode layer can be between 400 Å-700 Å.

In summary, in the oxide semiconductor composition, its manufacturing method, the thin film transistor and the display apparatus disclosed herein, the component elements of the oxide semiconductor composition include oxygen (O), indium (In), scandium (Sc), zinc (Zn), and according to some specific embodiments, the oxide semiconductor composition comprises indium scandium zinc oxide ($In_2Sc_2ZnO_7$). Herein, $Sc^{3+}$ and $In^{3+}$ has similar ionic radiuses. In addition, $Sc_2O_3$ has a relatively wide band gap, $Sc^{3+}$ has relatively low electronegativity, and the binding coordination of $Sc^{3+}$ and the binding coordination of $O^{2-}$ are similar.

As such, compared with a conventional oxide semiconductor composition for fabricating the semiconductor layer in existing technologies, the oxide semiconductor composition disclosed herein can reduce oxygen vacancy in the oxide, thereby the mobility of the oxide semiconductor composition can be improved, in turn resulting in an improved mobility of the oxide semiconductor.

According to some embodiments of the oxide semiconductor composition, the molar percentage of indium in the metal atoms indium, scandium and zinc is larger than 50%. Because $In^{3+}$ is mainly responsible for the transmission of carriers, if the content of indium is high, the number of electron transmission orbits of the oxide semiconductor composition can be ensured. Thereby a higher mobility of the oxide semiconductor composition disclosed herein can be ensured.

In the oxide semiconductor composition according to some embodiments of the disclosure, the total weight of the oxygen, indium, scandium and zinc is larger than 99.9992%. Therefore, the purity of $In_2Sc_2ZnO_7$ in the oxide semiconductor composition can be ensured, the mobility of the thin film transistor made of the oxide semiconductor composition can be ensured as well.

Furthermore, according to some embodiments, the surface roughness of the oxide semiconductor composition is smaller than about 1.8 μm, the average flexural strength of the oxide semiconductor composition is larger than about 60 megapascal, which together ensures a film quality of the semiconductor layer made of the oxide semiconductor composition.

It is noted that the above steps S301-S309 can substantially be also applied to manufacturing a display panel where the material of the semiconductor layer of the thin film transistor is an indium zirconium zinc oxide.

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An oxide semiconductor composition, comprising indium oxide, zinc oxide, and an oxide comprising an element of scandium; wherein the oxide semiconductor composition has a formula of $In_2Sc_2ZnO_7$.

2. The oxide semiconductor composition of claim 1, wherein the oxide comprising the element of scandium is scandium oxide.

3. The oxide semiconductor composition of claim 2, wherein a molar ratio of the scandium oxide to the zinc oxide is approximately 1:1.

4. The oxide semiconductor composition of claim 1, wherein a molar percentage of the indium oxide is larger than approximately 50%.

5. The oxide semiconductor composition of claim 1, having a density of approximately 7.03 g/cm$^3$.

6. The oxide semiconductor composition of claim 1, comprising impurity of lower than 8 ppm.

7. The oxide semiconductor composition of claim 1, having a surface roughness of smaller than 1.8 μm.

8. The oxide semiconductor composition of claim 1, having an average flexural strength is larger than 60 megapascal.

9. An oxide semiconductor composition, comprising indium oxide, zinc oxide, and an oxide comprising an element of scandium;
wherein an average diameter of scandium zinc oxide is smaller than 8 μm.

10. A method of manufacturing an oxide semiconductor composition comprising indium oxide, zinc oxide, and an oxide comprising an element of scandium, the method comprising:
preparing an oxide shaped object; and
sintering the oxide shaped object to form the oxide semiconductor composition;
wherein the oxide semiconductor composition has a formula of $In_2Sc_2ZnO_7$.

11. The method of claim 10, wherein the oxide comprising the element of scandium in the oxide semiconductor composition is scandium oxide.

12. The method of claim 11, wherein the preparing an oxide shaped object comprises:
providing indium oxide powder, scandium oxide powder, and zinc oxide powder; and
mixing the indium oxide powder, the scandium oxide powder, and the zinc oxide powder to thereby obtain the oxide shaped object.

13. The method of claim 12, wherein:
the indium oxide powder has a specific surface area of about 8-10 m$^2$/g;
the scandium oxide powder has a specific surface area of about 5-8 m$^2$/g; and
the zinc oxide powder has a specific surface area of about 3-5 m$^2$/g.

14. The method of claim 13, wherein the oxide shaped object has an average specific surface area of about 6-7 m$^2$/g.

15. The method of claim 12, a median diameter of each of the indium oxide powder, the scandium oxide powder, and the zinc oxide powder is smaller than about 1.8 μm.

16. The method of claim 12, wherein the sintering the oxide shaped object to form the oxide semiconductor composition comprises:
 pressing and sintering the oxide shaped object under a temperature of 1200° C.-1500° C. and in presence of oxygen to thereby obtain the oxide semiconductor composition.

17. A thin film transistor, comprising an active layer having an oxide semiconductor composition according to claim 1.

* * * * *